(12) United States Patent
Lu et al.

(10) Patent No.: US 12,200,984 B2
(45) Date of Patent: Jan. 14, 2025

(54) DISPLAY PANEL, DISPLAY DEVICE AND MANUFACTURING METHOD FOR DISPLAY PANEL

(71) Applicant: KunShan Go Visionox Opto Electronics Co., Ltd, Jiangsu (CN)

(72) Inventors: Jingru Lu, Kunshan (CN); Xiangqian Wang, Kunshan (CN)

(73) Assignee: KunShan Go Visionox Opto Electronics Co., Ltd, Kunshan (CN)

( * ) Notice: Subject to any disclaimer, the term of this patent is extended or adjusted under 35 U.S.C. 154(b) by 697 days.

(21) Appl. No.: 17/363,563

(22) Filed: Jun. 30, 2021

(65) Prior Publication Data

US 2021/0384285 A1 Dec. 9, 2021

Related U.S. Application Data

(63) Continuation of application No. PCT/CN2020/075545, filed on Feb. 17, 2020.

(30) Foreign Application Priority Data

Jun. 24, 2019 (CN) .......................... 201910548295.9

(51) Int. Cl.
*H10K 59/131* (2023.01)
*H10K 50/842* (2023.01)
(Continued)

(52) U.S. Cl.
CPC ....... *H10K 59/131* (2023.02); *H10K 50/8426* (2023.02); *H10K 71/00* (2023.02); *H10K 77/111* (2023.02)

(58) Field of Classification Search
CPC .... H10K 50/84; H10K 50/8426; H10K 71/00; H10K 71/50; H10K 71/111; H10K 77/111
See application file for complete search history.

(56) References Cited

U.S. PATENT DOCUMENTS 9,276,055 B1  3/2016  Son et al.
2015/0036300 A1  2/2015  Park et al.
(Continued)

FOREIGN PATENT DOCUMENTS

CN   106910429 A   6/2017
CN   107357068 A   11/2017
(Continued)

OTHER PUBLICATIONS

Office Action issued on Jul. 18, 2023, in corresponding Korean Application No. 10-2021-7023281, 12 pages.
(Continued)

*Primary Examiner* — Omar F Mojaddedi
(74) *Attorney, Agent, or Firm* — Maier & Maier, PLLC

(57) ABSTRACT

A display panel including a display area and a non-display area located on peripheral side of the display area, wherein the display panel includes: an array substrate comprising a first substrate and a second substrate that are laminated, wherein the second substrate is a flexible substrate, the second substrate comprises a first extension portion and a second extension portion, the first extension portion is located at the display area, the second extension portion extends from the first extension portion along a direction away from the first extension portion to the outside of the first substrate via the non-display area, and the second extension portion is disposed with a connection circuit for being electrically connected with an external device; a package cover plate located on one side of the second substrate away from the first substrate to encapsulate the array substrate.

9 Claims, 4 Drawing Sheets

(51) Int. Cl.
*H10K 71/00* (2023.01)
*H10K 77/00* (2023.01)
*H10K 77/10* (2023.01)

(56) References Cited

U.S. PATENT DOCUMENTS

| | | | |
|---|---|---|---|
| 2015/0362812 A1 | 12/2015 | Aoki et al. | |
| 2016/0064466 A1* | 3/2016 | Son | H10K 59/1213 |
| | | | 445/24 |
| 2017/0179423 A1* | 6/2017 | Kwon | H10K 59/131 |
| 2018/0108722 A1* | 4/2018 | Nishikawa | H10K 59/131 |
| 2018/0158893 A1* | 6/2018 | Tokuda | H10K 77/111 |
| 2018/0159055 A1 | 6/2018 | Namkung et al. | |
| 2018/0197933 A1 | 7/2018 | Son et al. | |
| 2019/0058028 A1 | 2/2019 | Won | |
| 2019/0165049 A1* | 5/2019 | Kim | H10K 50/8426 |

FOREIGN PATENT DOCUMENTS

| | | |
|---|---|---|
| CN | 108681123 A | 10/2018 |
| CN | 108803103 A | 11/2018 |
| CN | 208384313 U | 1/2019 |
| CN | 109648979 A | 4/2019 |
| CN | 109686251 A | 4/2019 |
| CN | 110246882 A | 9/2019 |
| EP | 3182474 A1 | 6/2017 |
| JP | 2018063386 A | 4/2018 |
| JP | 2018092018 A | 6/2018 |
| JP | 2018156116 A | 10/2018 |
| KR | 1020170047269 A | 5/2017 |
| TW | 201913332 A | 4/2019 |
| WO | 2019074332 A1 | 4/2019 |

OTHER PUBLICATIONS

Search Report issued on Jul. 19, 2022 in connection with corresponding European Application No. 20832646.2; 8 pages.
Office Action issued on Jan. 4, 2023, in corresponding Japanese Application No. 2021-549078, 10 pages.
PCT International Search Report for PCT/CN2020/075545, dated Apr. 21, 2020, 12 pages.
The first office action and search report dated Dec. 24, 2020 for Chinese Application No. 201910548295.9, 8 pages.
The first office action and search report dated Jan. 21, 2021 for TW Application No. 109105359, 5 pages.
The First Office Action issued on Sep. 13, 2022, in connection with corresponding Japanese Application No. 2021-549078 (24 pp., including machine-generated English translation).
Office Action issued on Nov. 24, 2023, in corresponding European Application No. 20832646.2, 7 pages.

* cited by examiner

US 12,200,984 B2

DISPLAY PANEL, DISPLAY DEVICE AND MANUFACTURING METHOD FOR DISPLAY PANEL

CROSS-REFERENCE OF RELATED APPLICATOINS

This application is a continuation of International Application No. PCT/CN2020/075545, filed on Feb. 27, 2020, which claims priority to Chinese Patent Application No. 201910548295.9, filed on Jun. 24, 2019, both of which are hereby incorporated by reference in their entireties.

TECHNICAL FIELD

The present application relates to the field of displaying equipment, and more particularly to a display panel, a display device, and a manufacturing method for the display panel.

BACKGROUND

With the continuous update of the display module technology, the small size panel is gradually moving toward lighter and thinner, high screen-to-body ratio, and ultra-narrow borders or even boundless development. The display panel of the conventional structure typically includes a display area and a non-display area located on the peripheral side of the display area. The non-display area is used to arrange and bind the flexible circuit, and the existence of the flexible circuit will occupy more non-display space, which is not conducive to the narrow border design Therefore, there is an urgent need for a display panel that enables narrow border design, a display device and a manufacturing method for the display panel.

SUMMARY

In one aspect, embodiments of the present application provides a display panel having a display area and a non-display area located on peripheral side of the display area, and the display panel includes: an array substrate including a first substrate and a second substrate that are laminated, wherein the second substrate is a flexible substrate, the second substrate includes a first extension portion and a second extension portion, the first extension portion is located at the display area, and the second extension portion extends from the first extension portion along a direction away from the first extension to the outside of the first substrate, via the non-display area, the second extension portion is provided with a connection circuit for being electrically connected with an external device; a package cover plate, located on one side of the second substrate away from the first substrate to encapsulate the array substrate.

The display panel according to the present application can solve the problem that the panel border is excessively wide. In the display panel provided in embodiments of the present application, the display panel includes an array substrate and a package cover plate, and the package cover plate provides protection to the array substrate. The array substrate includes a first substrate and a second substrate that are laminated, the second substrate being a flexible substrate, and the second extension portion of the second substrate projects out of the first substrate, and the second substrate can be disposed to bend. The second extension portion has a connection circuit for being electrically connected to an external device, so the array substrate can be connected with an external controller by a second extension portion. When the second extension portion bends to the back of the first substrate, it is possible to save the circuit binding space on the display panel to achieve the purpose of the narrow border.

In another aspect, embodiments of the present application also provides a display device including the above display panel.

In yet another aspect, embodiments of the present application also provides a method of manufacturing a display panel, and the display panel includes a display area and a non-display area disposed on at least one side of the display area, and the method comprises:

providing a first substrate;

forming a second substrate on the first substrate, the second substrate is a flexible substrate, the second substrate includes a first extension portion and a second extension portion, the first extension portion is located in the display area, and the second extension portion is provided with a connection circuit;

peeling off at least part of the first substrate and the second substrate from an edge of the first substrate;

cutting off the stripped portion of the first substrate, so that the second extension portion extends from the first extension portion along a direction away from the first extension portion to the outside of the first substrate via the non-display area;

providing a package cover plate on one side of the second substrate away from the first substrate to encapsulate the second substrate and the first substrate.

BRIEF DESCRIPTION OF THE DRAWINGS

Other features, objects, and advantages of the present application will become more apparent by reading the following detailed description of the non-limiting embodiments with reference to the accompanying drawings, in which the same or similar reference signs indicate the same or similar features.

DETAILED DESCRIPTION

In order to better understand the present application, the display panel, the display device and the manufacturing method for the display panel according to an embodiment of the present application will be described in detail below with reference to FIGS. 1 to 8.

Figure 1:
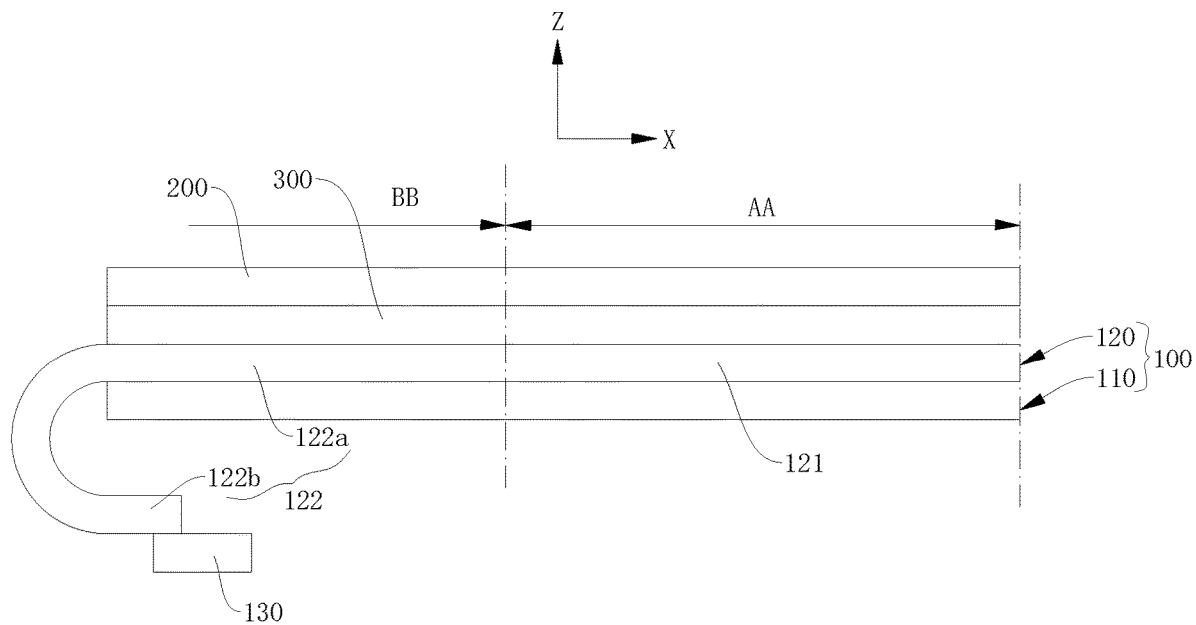
FIG. 1 is a schematic structural diagram of a display panel according to an embodiment of the present application.

FIG. 1 is a schematic structural diagram of a display panel according to an embodiment of the present application, and the display panel has a display area and a non-display area located on the peripheral side of the display area. The display panel includes an array substrate 100 and a package cover plate 200. The array substrate 100 includes a first substrate 110 and a second substrate 120 laminated along the first direction (the Z direction in FIG. 1). The second substrate 120 is a flexible substrate. The second substrate 120 includes a first extension portion 121 and a second extension portion 122. The first extension portion 121 is located in the display area. The second extension portion 122 extends from the first extension portion 121 via the non-display area to the outside of the first substrate 110 in a direction away from the first extension portion 121. The second extension portion 122 is provided with a connection circuit for being electrically connected with the external device so that the array substrate 100 can be electrically connected with the external device by the second extension portion 122; The package cover plate 200 is located on one side of the second substrate 120 away from the first substrate 110 so as to encapsulate the array substrate 100.

In the figures, the display area AA and the non-display area BB area are shown in the dot dash line. The dot dash line does not constitute a definition for the structure of the display panel, and the dot dash line is to show the dividing point of the AA area and the BB area.

The second substrate 120 can be made of any suitable material. In some embodiments, the second substrate 120 can be made of one or several materials selected from silicone rubber, urethane elastomer and acrylic elastomer.

In the display panel of embodiments of the present application, the display panel includes an array substrate 100 and a package cover plate 200, and the package cover plate 200 provides protection for the array substrate 100. The array substrate 100 includes a first substrate 110 and a second substrate 120 that are laminated, and the second substrate 120 is a flexible substrate. The second extension portion 122 of the second substrate 120 projects out of the first substrate 110 such that the second substrate 120 can be disposed to bend. The second extension portion 122 has a connection circuit 124 for being electrically connecting with an external device, and thus the array substrate 100 can be connected with an external device such as the controller by the second extension portion 122. When the second extension portion 122 is bent to the back of the first substrate 110, the circuit binding space on the display panel can be saved, thereby the purpose of the narrow border is attained.

The portion of the second extension portion 122 projecting out of the first substrate 110 can have any suitable shape. In some alternative embodiments, the second extension portion 122 includes a connecting section 122a connected with the first extension portion 121 and a bending section 122b that is disposed by the connecting section 122a bending in the direction closer to the first substrate 110, that is, the second extension portion 122 includes a connecting section 122a connected with the first extension portion 121 and a bending section 122b that is disposed by the connecting section 122a bending in the direction away from the package cover plate 200 toward the display area AA. The free end of the bending section 122b away from the connecting section 122a is provided with a control circuit 130. The bending section 122b is a portion of the second extension portion 122 projecting out of the first substrate 110. The control circuit 130 can be disposed in any suitable location. For example, the control circuit 130 may be disposed on one side of the free end away from the first substrate 110, or the control circuit 130 is located between the free end and the first substrate 110, i.e., the control circuit 130 is located on one side of the free end close to the first substrate 110.

In these embodiments, the second extension portion 122 includes a bending section 122b. The bending section 122b is disposed to bend and the free end of the bending section 122b is connected with the control circuit 130 such that the control circuit 130 can be connected to the back of the first substrate 110 by the bending section 122b and thus the binding space is saved to achieve the purpose of the narrow border. The control circuit 130 can be implemented by any suitable control circuit, for example, a Chip On Film (COF) circuit.

In the display panel manufactured by embodiments of the present application, the entire array substrate 100 does not bend, and only part of the second substrate 120 bends. The bending portion is thinner, which facilitates to bending treatment, and increases the bending degree appropriately, thus reducing the distance between the free end and the first substrate 110 after bending, and enabling the display panel to be thinner.

The connection circuit 124 may be disposed on the second extension portion 122 in many ways, for example, the connection circuit 124 is disposed on the surface of the second extension portion 122 close to the first substrate 110. At this time, the connection end of the connection circuit 124 is exposed to the surface of the second extension portion 122 close to the first substrate 110. The control circuit 130 may be disposed at the surface of the second extension portion 122 close to the first substrate 110 in order to be connected with the connection circuit 124. Therefore, when the second extension portion 122 is disposed to bend, the control circuit 130 can be disposed between the free end and the first substrate 110.

The first substrate 110 can be any suitable form of substrate, and the package cover plate 200 can be any suitable form of cover plate. For example, in some alternative embodiments, the first substrate 110 can be a flexible substrate or a hard substrate, and the package cover plate 200 can be a hard cover plate or a flexible cover plate.

In some preferred embodiments, the first substrate 110 is a hard substrate, and the package cover plate 200 is a hard cover plate, and an adhesive layer 300 is further disposed between the package cover plate 200 and the second substrate 120 so that the second substrate 120 is connected with the package cover plate 200 by the adhesive layer 300. The adhesive layer 300 can be disposed in many ways, for example, the adhesive layer 300 is an optical glue layer.

In these embodiments, since the bending section 122b of the second substrate 120 protrudes out of the first substrate 110, even if the first substrate 110 is disposed as a hard substrate, it does not affect the bending of the second extension portion 122 of the second substrate 120 and the purpose of the narrow border can also be achieved. The package cover plate 200 is a hard cover plate, at this time the flexible second substrate 120 is bonded to the package cover plate 200 via the adhesive layer 300. In the present embodiment, the display panel is a hard display panel, and the hard first substrate 110 is connected with the package cover plate 200 by the flexible second substrate 120 and the adhesive layer 300, there is no need for Frit package, i.e. there is no need for a glass glue package. It is possible to further save the side space of the panel to achieve the purpose of the narrow border.

The first substrate 110 can be made of any suitable material. For example, the first substrate 110 is glass or the like. The package cover plate 200 can be made of any suitable material. For example, the package cover plate 200 is a glass cover plate.

In any of the above embodiments, the display panel further includes a pixel layer 400 and a drive device layer 500 disposed correspondingly to the display area, and the drive device of the drive device layer 500 is connected to the connection circuit 124 so that the drive device is connected with the external device through the connection circuit 124. The pixel layer 400 refers to a pixel definition layer for setting red green blue sub-pixel, and the drive device layer 500 refers to a TFT device layer for setting the drive device.

The pixel layer 400 and the drive device layer 500 can be located in any suitable location. In some alternative embodiments, the pixel layer 400 and the drive device layer 500 may simultaneously located at the first substrate 110 or the second substrate 120, or the pixel layer 400 is located at the second substrate 120, and the drive device layer 500 is located at the first substrate 110.

When the pixel layer 400 is disposed at the second substrate 120, a package layer 123 is further disposed on one side of the second substrate 120 away from the first substrate 110, and the second substrate 120 is bonded to the adhesive layer 300 by the package layer 123. By disposing the package layer 123, the sub-pixels of the pixel layer 400 can be operated normally. When the pixel layer 400 is disposed at the second substrate 120, the drive device layer 500 can be disposed at the second substrate 120 or the first substrate 110.

Figure 2:
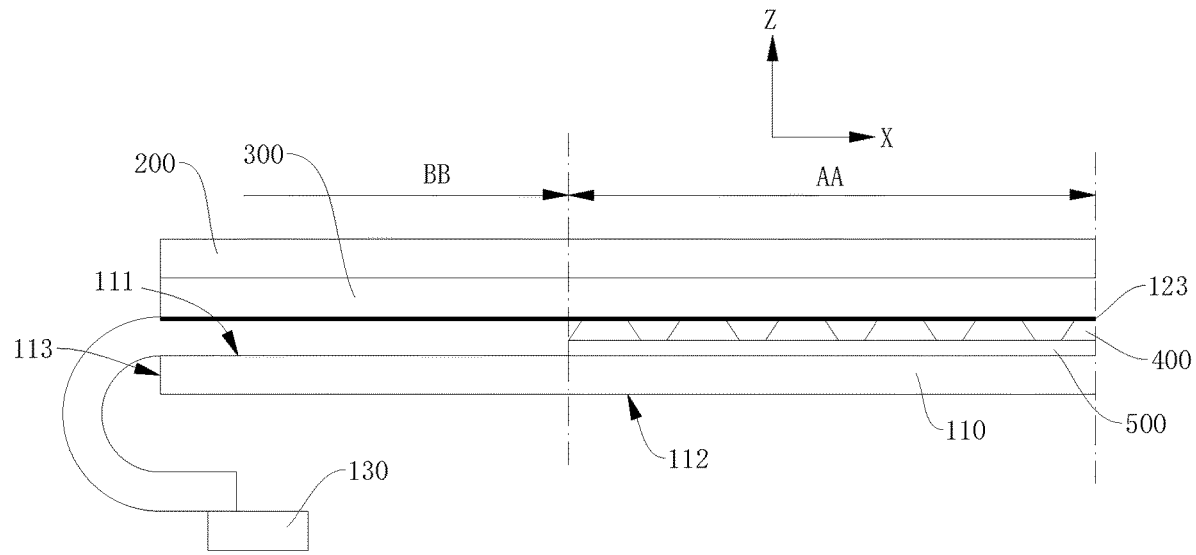
FIG. 2 is a schematic structural diagram of another display panel based on the embodiment shown in FIG. 1 of the present application.

As shown in FIG. 2, in some alternative embodiments, both the pixel layer 400 and the drive device layer 500 are located at the second substrate 120, and the drive device layer 500 is located on one side of pixel layer 400 facing the first substrate 110. A package layer 123 is disposed on one side of the second substrate 120 away from the first substrate 110; the connection pin of the drive device extends from the display area to the non-display area, and is connected to the connection circuit 124 on the non-display area.

In these embodiments, both the pixel layer 400 and the driving device layer 500 are located at the second substrate 120, and the first substrate 110 is a hard substrate to increase the strength of the array substrate 100. When the drive device layer 500 is located at the second substrate 120, the drive device layer 500 is located within the first extension portion 121, and the connection pin of the drive device extends from the first extension portion 121 to the second extension portion 122 and is connected with the connection circuit 124 in the second extension portion 122. That is, the connection pin of the drive device extends from the display area to the non-display area and is connected with the connection circuit 124 on the non-display area. The driver device can be connected to the external device by the control circuit 124. For example, the drive device can be connected with the control circuit 130 through the connection circuit 124.

As shown in FIGS. 3 to 6, in other alternative embodiments, the pixel layer 400 is located at the second substrate 120, and the drive device layer 500 is located at the first substrate 110. A package layer 123 is further disposed on one side of the second substrate 120 away from the first substrate 110. At this time, the connection pin 510 of the drive device is exposed by the first surface 111 of the first substrate 110 toward the second substrate 120 so as to be connected with the connection circuit 124.

In these embodiments, the pixel layer 400 and the drive device layer 500 are disposed at the second substrate 120 and the first substrate 110 respectively. When the first substrate 110 is formed, the drive device layer 500 can be formed within the first substrate 110. When the second substrate 120 is formed, the pixel layer 400 is formed within the second substrate 120, and the pixel layer 400 may correspond to the drive device layer 500. The drive device layer 500 can drive the pixel layer 400 to display. The connection pin 510 of the drive device is exposed by the first surface 111. When the first substrate 110 and the second substrate 120 are connected with each other, the drive device and the connection circuit 124 are connected with each other.

Figure 3:
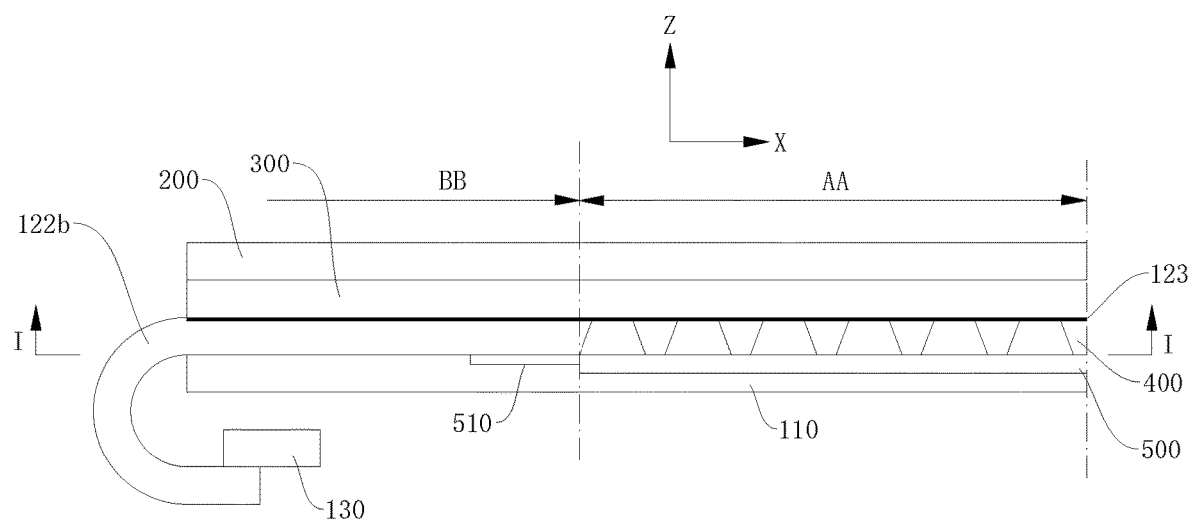
FIG. 3 is a schematic structural diagram of another display panel based on the embodiment shown in FIG. 1 of the present application.
Figure 4:
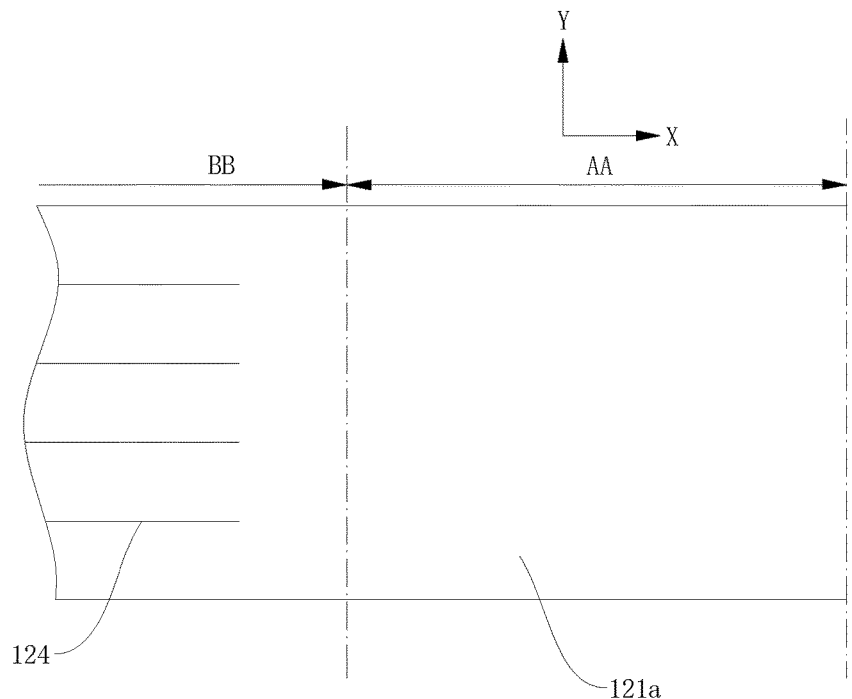
FIG. 4 is a schematic structural diagram at I-I in FIG. 3.

The drive device and the connection circuit 124 are connected with each other in many ways. As shown in FIGS. 3 and 4, the connection end of the connection circuit 124 is exposed to the surface of the second extension portion 122 close to the first substrate 110. The connection pin 510 of the drive device extends from the display area to the non-display area, and is exposed to the first surface 111 in the non-display area to be connected with the connection circuit 124.

In these embodiments, the connection end of the connection circuit 124 is exposed to the surface of the second extension portion 122, and the connection pin 510 of the drive device is exposed to the first surface 111. When the second substrate 120 is formed on the first substrate 110, the connection between the connection circuit 124 and the drive device is attained.

Figure 5:
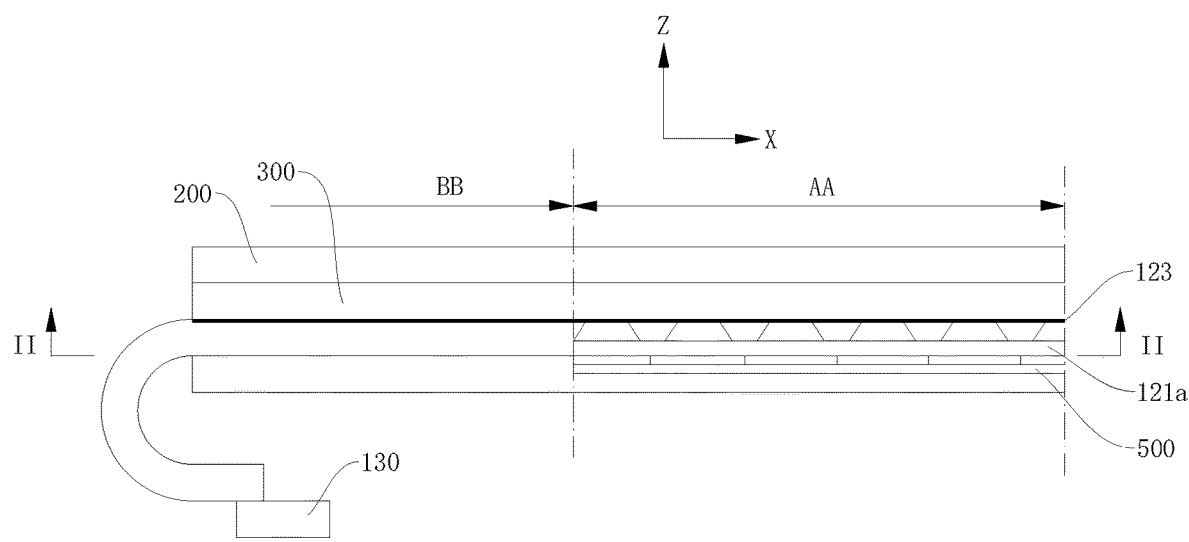
FIG. 5 is a schematic structural diagram of another display panel based on the embodiment shown in FIG. 1 of the present application.
Figure 6:
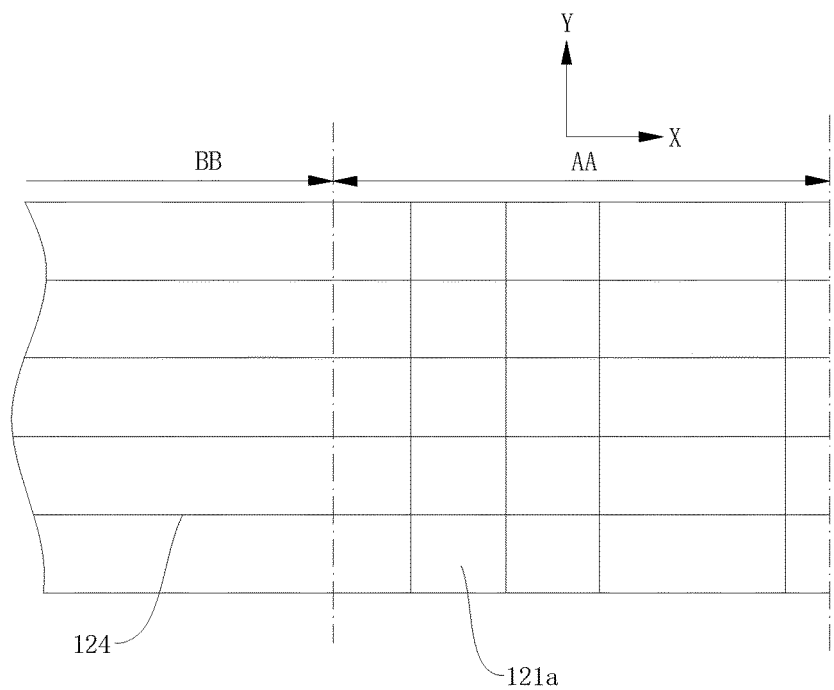
FIG. 6 is a schematic structural diagram at II-II of FIG. 5.

In other alternative embodiments, as shown in FIGS. 5 and 6, the first extension portion 121 includes a wire layer 121a. The wire layer 121a and the connection circuit 124 are connected with each other, and the wire of at least part of the wire layer 121a is exposed to the surface of the second substrate 120 facing the first substrate 110. The connection pin 510 of the drive device is exposed by the display area and is connected with the wire layer 121a so as to be connected to the connection circuit 124 through the wire layer 121a.

In these embodiments, the first extension portion 121 includes a wire layer 121a. A wire of the wire layer 121a is exposed to the surface of the second substrate 120 facing the first substrate 110, and the connection pin 510 is exposed by the display area so that when the second substrate 120 is formed on the first substrate 110, the drive device can be connected with the wire layer 121a, and the wire of the wire layer 121a is connected to the connection circuit 124, so that the drive device can be connected with the connection circuit 124 by the wire layer 121a.

The driver layer 500 includes a gate line extending in the second direction (X direction in FIG. 6) and a data line extending along the third direction (Y direction in FIG. 6). The gate line and the data line intersect with each other in the drive device layer 500 in a grid shape. The wire layer 121a can be any suitable arrangement. As shown in FIG. 6, in some alternative embodiments, the wire of the wire layer 121a has a mesh shape, and the wire in the wire layer and the data line, the gate line overlap with each other, and the wire is exposed by the surface of the second substrate 120 facing the first substrate 110, thereby the wire is connected with the gate line and/or data line of each drive device. The overlapping of the wire and the gate line, the data line can reduce the distance between the wire and the data line /or the gate line, and does not affect the normal display of the display panel at the same time. The wire of the wire layer 121a and the data line, the gate line overlapping with each other refers to that the wire of the wire layer 121a and the data line, the gate line overlap with each other in the first direction of FIG. 1.

The wire of the wire layer 121a is disposed in many ways. For example, the wire may be directly disposed at the surface of the wire layer 121a toward the first substrate 110, and the connection pin 510 of the first substrate 110 is exposed to the first surface 111 so as to be connected with the wire. Alternatively, the wire is located within the wire layer 121a, and the wire is exposed by the surface of the wire layer 121a toward the first substrate 110, and the connection pin 510 and the wire are connected with each other.

Figure 7:
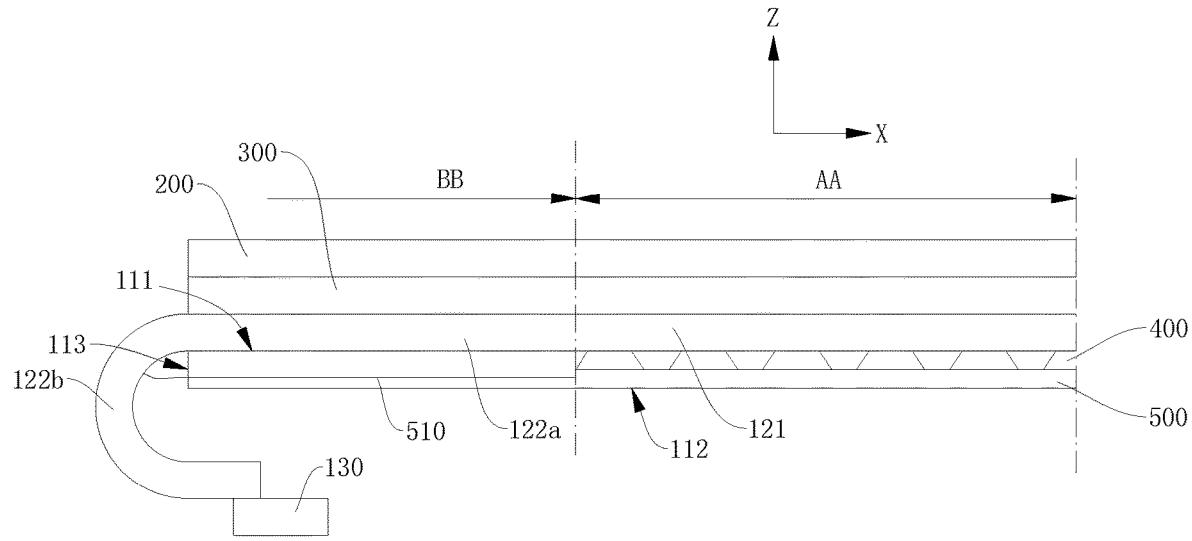
FIG. 7 is a schematic structural diagram of another display panel based on the embodiment shown in FIG. 1 of the present application.

In still another alternative embodiment, as shown in FIG. 7, the transparency of the first extension portion 121 is greater than or equal to 60%, and the connection circuit 124 is exposed to the surface of the second extension portion 122 facing the first substrate 110; the first substrate 110 includes a first surface 111 facing the second substrate 120, a second surface 112 away from the second substrate 120 and a side surface 113 connecting the first surface 111 and the second surface 112; the drive device layer 500 and the pixel layer 400 of the display panel are disposed correspondingly to the display area and located at the first substrate 110, the drive device layer 500 is located on one side of the pixel layer 400 away from the second substrate 120, and the connection pin 510 of the drive device is exposed by the side surface 113 to be connected with the connection circuit 124.

In these embodiments, both the pixel layer 400 and the drive device layer 500 are disposed at the first substrate 110, and the second substrate 120 is used as an intermediate connection layer. The first substrate 110 can be connected to the package cover plate 200 by the second substrate 120 and the adhesive layer 300. When the second substrate 120 is located on one side of the pixel layer 400 close to the package cover plate 200, the transparency of the first extension portion 121 on the second substrate 120 is greater than or equal to 60%, so that the normal display of the display panel is not affected, and the light of the pixel layer 400 can be exposed through the first extension portion 121. The connection circuit 124 is exposed to the surface of the second extension portion 122 facing the first substrate 110, and the connection pin 510 of the drive device is exposed by the side surface 113, and thus the connection pin 510 of the drive device can be connected to the connection circuit 124 on the side surface 113.

The second embodiment of the present application also provides a display device including the display panel of any of the above first embodiment. The display device can be any suitable type. For example, the display device can be a mobile terminal, a mobile phone, a computer display, or a notebook display, and the like.

Since the display device of the present application includes the above-described display panel, the display device of the present embodiment has the advantageous effect of the display panel of any of the above embodiments, which will not be described herein.

Figure 8:
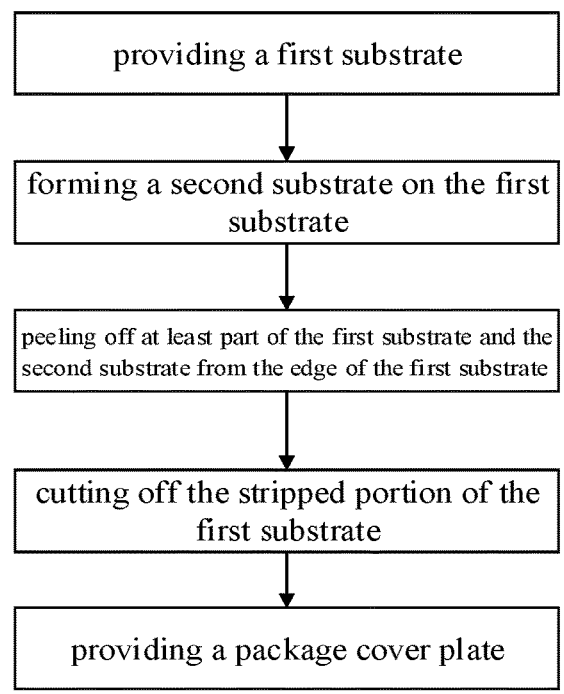
FIG. 8 is a schematic flowchart showing a method of manufacturing a display panel according to an embodiment of the present application.

Referring to FIG. 8, the third embodiment of the present application also provides a method of manufacturing a display panel which is the display panel of any of the above first embodiment, and the method of manufacturing a display panel comprises:

Step S1: providing a first substrate.

The first substrate 110 can have any suitable characteristics. For example, the first substrate 110 can be a flexible substrate or a hard substrate. Preferably, the first substrate 110 is a hard substrate, facilitating the subsequent components evaporating or printing on a hard substrate.

Step S2: forming a second substrate on the first substrate.

The second substrate 120 is a flexible substrate, and the second substrate 120 includes a first extension portion 121 and a second extension portion 122, and the first extension portion 121 is located in the display area, and the second extension portion 122 is provided with a connection circuit 124, and the display panel can be connected to an external device through the connection circuit 124 on the second extension portion 122. The second substrate 120 is formed on the first substrate 110 by evaporating or printing or the like.

Step S3: peeling off at least part of the first substrate and the second substrate from each other from an edge of the first substrate.

Step S4: cutting off the stripped portion of the first substrate.

The stripped first substrate 110 is cut off, and the second extension portion 122 extends from the first extension portion 121 in the direction away from the first extension portion 121 to the outside of the first substrate 110 via the non-display area.

Step S5: disposing the package cover plate.

The package cover plate 200 is provided on one side of the second substrate 120 away from the first substrate 110 to encapsulate the second substrate 120 and the first substrate 110.

In these embodiments, a flexible second substrate 120 is formed on the first substrate 110, and the partial edge of the first substrate 110 is peeled off after the second substrate 120 is formed. The second extension portion 122 protrudes out of the first substrate 110, and the portion of the second extension portion 122 protruding out of the first substrate 110 can be disposed to bend. Therefore, the external device with which the connection circuit 124 is connected can be located on the back of the first substrate 110, saving a binding space to achieve a narrow border. Further, in the display panel manufactured by the present application, the entire array substrate 100 does not bend, and only part of the second substrate 120 bends. The bending portion is thinner, which facilitate to bending operation and can appropriately increase the bending degree, and reduce the distance between the free end of the second extension portion 122 and the first substrate 110 after bending, and the display panel is thinner.

Although the present application has been described with reference to the preferred embodiments, various modifications can be made and the components therein can be replaced with equivalents without departing from the scope of the present application. In particular, the various technical features mentioned in various embodiments may be combined anywhere as long as there is no structural conflict. The present application is not limited to a particular embodiment disclosed in the text, but includes all of the technical solutions falling within the scope of the claims.

What is claimed is:

1. A display panel comprising a display area and a non-display area located on peripheral side of the display area, wherein the display panel comprises:
    an array substrate comprising:
        a first substrate and
        a second substrate that are laminated, wherein the second substrate is a flexible substrate the first substrate comprises a first surface facing the second substrate, a second surface away from the second substrate, and a side surface connecting the first surface and the second surface, and the second substrate comprises:
            a first extension portion that is transparent, wherein a transparency of the first extension portion is greater than or equal to 60%, and a second extension portion, the second extension portion extends from the first extension portion along a direction away from the first extension portion to the outside of the first substrate via the non-display area, is disposed with a connection circuit for being electrically connected with an external device, and the connection circuit is exposed to the surface of the second extension portion facing the first substrate; and a package cover plate located on one side of the second substrate away from the first substrate that is configured to encapsulate the array substrate, wherein a drive device layer and a pixel layer of the display panel are disposed correspondingly to the display area, the drive device layer is located on one side of the pixel layer away from the second substrate, and a connection pin of the drive device layer is exposed by the side surface to be connected with the connection circuit.

2. The display panel of claim 1, wherein a connection end of the connection circuit is exposed to the surface of the second extension portion close to the first substrate and the connection pin of the drive device extends from the display area to the non-display area and is exposed to the first surface in the non-display area to be connected with the connection circuit.

3. The display panel of claim 1, wherein the wire is disposed at the surface of the wire layer toward the first substrate.

4. The display panel of claim 1, wherein the wire is located within the wire layer, the wire is exposed by the surface of the wire layer towards the first substrate, and the connection pin and the wire are connected with each other.

5. The display panel of claim 1, wherein the second extension portion further comprises:
a connecting section connected with the first extension portion.

6. The display panel of claim 1, wherein the control circuit is disposed on one side of the free end away from the first substrate.

7. The display panel of claim 1, wherein the control circuit is located on one side of the free end close to the first substrate.

8. A display device comprising the display panel according to claim 1.

9. A method of manufacturing a display panel comprising a display area and a non-display area disposed on peripheral side of the display area, wherein the method comprises:
providing a first substrate;
forming a second substrate on the first substrate, wherein the second substrate is a flexible substrate, the first substrate comprises a first surface facing the second substrate, a second surface away from the second substrate, and a side surface connecting the first surface and the second surface, and the second substrate comprises:
a first extension portion that is transparent, wherein a transparency of the first extension portion is greater than or equal to 60%, and
a second extension portion, and the second extension portion is provided with a connection circuit and the connection circuit is exposed to the surface of the second extension portion facing the first substrate;
peeling off at least part of the first substrate and the second substrate from an edge of the first substrate;
cutting off the stripped portion of the first substrate so that the second extension portion extends from the first extension portion along a direction away from the first extension portion to the outside of the first substrate via the non-display area; and
providing a package cover plate on one side of the second substrate away from the first substrate to encapsulate the second substrate and the first substrate, wherein a drive device layer and a pixel layer of the display panel are disposed correspondingly to the display area, the drive device layer is located on one side of the pixel layer away from the second substrate, and a connection pin of the drive device layer is exposed by the side surface to be connected with the connection circuit.

* * * * *